US008359412B2

(12) United States Patent
Park et al.

(10) Patent No.: US 8,359,412 B2
(45) Date of Patent: Jan. 22, 2013

(54) DATA STORAGE DEVICE TO CONTROL SIGNAL STRENGTH OF MEMORY CHANNEL AND SETTING METHOD THEREOF

(75) Inventors: Jonggyu Park, Hwaseong-si (KR); Jong-Min Kim, Hwaseong-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 6 days.

(21) Appl. No.: 12/769,022

(22) Filed: Apr. 28, 2010

(65) Prior Publication Data

US 2010/0293305 A1    Nov. 18, 2010

(30) Foreign Application Priority Data

May 13, 2009   (KR) .................................. 2009-41737

(51) Int. Cl.
*G06F 13/00*     (2006.01)

(52) U.S. Cl. ........................... 710/33; 365/211; 365/212

(58) Field of Classification Search .................... 326/32; 365/212
See application file for complete search history.

(56) References Cited

U.S. PATENT DOCUMENTS

| 6,298,426 | B1 | 10/2001 | Ajanovic | |
| 6,496,911 | B1* | 12/2002 | Dixon et al. | ................... 711/170 |
| 7,157,932 | B2* | 1/2007 | El-Kik et al. | ..................... 326/32 |
| 7,161,851 | B2* | 1/2007 | Peterson et al. | ......... 365/189.11 |
| 7,411,885 | B2* | 8/2008 | Liu | ............................... 369/116 |
| 2005/0146965 | A1* | 7/2005 | Kim et al. | ..................... 365/211 |
| 2008/0238530 | A1* | 10/2008 | Ito et al. | ........................ 327/513 |
| 2010/0268901 | A1* | 10/2010 | Shaeffer | ....................... 711/155 |

* cited by examiner

*Primary Examiner* — Elias Mamo
(74) *Attorney, Agent, or Firm* — Stanzione & Kim, LLP

(57) ABSTRACT

A data storage device includes a plurality of memory devices and a memory controller. The memory controller exchanges data with the plurality of memory devices via a plurality of channels and adjusts drive strength of the plurality of channels by referring to at least one of the number of the plurality of memory devices and current temperature.

19 Claims, 16 Drawing Sheets

$\tau = Z_{Load} \cdot C_{Load}$ $\tau_1 < \tau_2 < \tau_3$

DATA STORAGE DEVICE TO CONTROL SIGNAL STRENGTH OF MEMORY CHANNEL AND SETTING METHOD THEREOF

CROSS-REFERENCE TO RELATED APPLICATIONS

This U.S. non-provisional patent application claims the benefit of priority under 35 U.S.C. § 119 of Korean Patent Application No. 10-2009-0041737, filed on May 13, 2009, the entire contents of which are hereby incorporated by reference.

BACKGROUND

1. Field of the Invention

The present disclosure herein relates to an electronic device, and more particularly, to a data storage device to adaptively control signal strength of a memory channel and a method of setting the same.

2. Description of the Related Art

Generally, since non-volatile semiconductor memories (e.g., flash memories) can retain stored data even when powered off, the non-volatile semiconductor memories are widely used in computers and memory cards. Recently, as the use of mobile devices such as mobile phones, PDAs, and digital cameras increases rapidly, the non-volatile semiconductor memories are being widely used as storage devices instead of Hard Disk Drives (HDDs). Devices using the non-volatile semiconductor memories as storage media are called solid state drives or solid state disks. Hereinafter, the solid state drives will be briefly referred to as SSDs.

High-speed data I/O is possible in an access operation to an SSD, and a mechanical delay or an error rate is very low. Also, the SSDs are not easily damaged by external impacts, and have excellent properties in generation of heat, noise, and power consumption. Furthermore, SSDs have the advantages of compactness and lightness. Accordingly, demands on SSDs that do not use a mechanically-rotating platter are rapidly increasing in accordance with today's mobile trends of low-power and large-capacity.

With the trends of the low power and high capacity, non-volatile memory devices used as storage media of SSDs need to provide a large storage capacity. In order to expand the storage capacity, the number of the non-volatile memory devices equipped in SSDs may be increased, or large-capacity non-volatile memory devices may be used. However, in order to realize the low-power and large-capacity of SSDs, a high-reliable interfacing between the non-volatile memory devices provided in the SSDs and an SSD controller is required. That is, signal integrity between the non-volatile memory devices and the SSD controller is becoming the most important issue for the low-power and large-capacity of the SSDs.

SUMMARY

The present disclosure provides a data storage device and a method of setting the same, which can control signal strength of a memory channel adaptively according to environmental changes.

Additional features and utilities of the present general inventive concept will be set forth in part in the description which follows and, in part, will be obvious from the description, or may be learned by practice of the general inventive concept.

Features and/or utilities of the present general inventive concept may be realized by a data storage device including a plurality of memory devices and a memory controller to exchange data with the plurality of memory devices via a plurality of channels and to adjust drive strength of the plurality of channels by referring to at least one of the number of the plurality of memory devices and current temperature.

Features and/or utilities of the present general inventive concept may also be realized by a method of setting memory channels of a data storage device, the method including detecting the number of the memory devices connected to the memory channels, respectively, detecting a temperature of the data storage device, and setting an output driver to drive the memory channels at drive strength corresponding to at least one of the number of memory devices and the temperature.

Features and/or utilities of the present general inventive concept may also be realized by a memory module including a plurality of memory devices to store data and a controller to transmit data to and from the plurality of memory devices via a plurality of channels, and the controller may detect a number of memory devices connected to each channel and may adjust a drive signal to drive the plurality of memory devices according to the detected number of memory devices.

The controller may detect a total number of memory devices corresponding to all the channels and adjusts the drive signals to each channel according to the detected total number of memory devices. The controller may adjust the drive signal to each separate channel according to the detected number of memory devices of each separate channel.

The controller may be mounted to a circuit board and the circuit board may include a plurality of slots to receive the plurality of memory devices.

Each slot may correspond to a separate channel.

The memory module may include a buffer memory connected to the controller to temporarily store data to transmit to or from the plurality of memory devices.

The memory module may further include a temperature sensor to detect a temperature of at least a portion of the memory module, and the controller may adjust the drive signal to drive the plurality of memory devices according to the detected number of memory devices and the detected temperature.

The temperature sensor may detect a temperature of the controller.

The controller may include a memory device interface to transmit data to the plurality of memory devices via the plurality of channels, a host interface to transmit data to and from a host device external to the memory module, and a central processing unit (CPU) to control operation of the memory device interface and the host interface.

The memory device interface may include at least one register, and the controller may adjust the contents of the at least one register to adjust the drive signal to the plurality of memory devices.

The at least one register may include at least a first register and a second register, and the controller may adjust the contents of the first register according to the detected number of memory devices, and the controller may adjust the contents of the second register according to the detected temperature.

The at least one register may include a plurality of registers to correspond to the plurality of channels, and the controller may adjust the contents of each respective register to adjust the drive signal to each respective channel.

Features and/or utilities of the present general inventive concept may also be realized by a computing device including a memory module including a controller and a plurality of memory devices, a user interface to transmit at least one of data and commands to or from the computing device, a power supply to provide power to components computing device, and a CPU to control operation of the memory module, the user interface, and the power supply. The controller of the memory module may detect a number of memory devices connected to each channel and may adjust a drive signal to drive the plurality of memory devices according to the detected number of memory devices.

The controller of the memory module may detect a temperature of the memory module and may adjust the drive signal to drive the plurality of memory devices according to the detected number of memory devices and the detected temperature.

Features and/or utilities of the present general inventive concept may also be realized by a method of driving a plurality of memory devices including detecting a number of memory devices connected to a plurality of channels of a memory module and adjusting a drive signal to drive the plurality of memory devices based on the detected number of memory devices.

Detecting a number of memory devices may include detecting a total number of memory devices corresponding to all the channels and may adjust the drive signals to each channel according to the detected total number of memory devices.

Adjusting a drive signal to drive the plurality of memory devices may include adjusting the drive signal to each separate channel according to the detected number of memory devices of each separate channel.

The method may further include detecting a temperature of the memory module and adjusting the drive signal based on the detected number of memory devices and the detected temperature.

Adjusting the drive signal may include adjusting the contents of at least one register to adjust the drive signal.

The at least one register may include a first register and a second register, and adjusting the contents of the at least one register may include adjusting the contents of the first register based on the detected number of memory devices and adjusting the contents of the second register based on the detected temperature.

Adjusting the contents of the at least one register may include accessing a drive strength table to determine a drive strength value to correspond to the detected number of memory devices and the detected temperature, and adjusting the contents of the at least one register based on the determined drive strength value.

Adjusting the drive signal may include adjusting the drive signal corresponding to the adjusted contents of the first register by a value corresponding to the adjusted contents of the second register.

Adjusting the contents of at least one of the first and second registers may include accessing a drive strength table to determine a drive strength value to correspond to at least one of the detected number of memory devices and the detected temperature and adjusting the contents of the at least one of the first and second registers based on the determined drive strength value.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the present general inventive concept. In the drawings.

The above and/or other aspects of the present general inventive concept will become apparent and more readily appreciated from the following description of the exemplary embodiments, taken in conjunction with the accompanying drawings, in which.

DETAILED DESCRIPTION OF THE EMBODIMENTS

Figure 1:
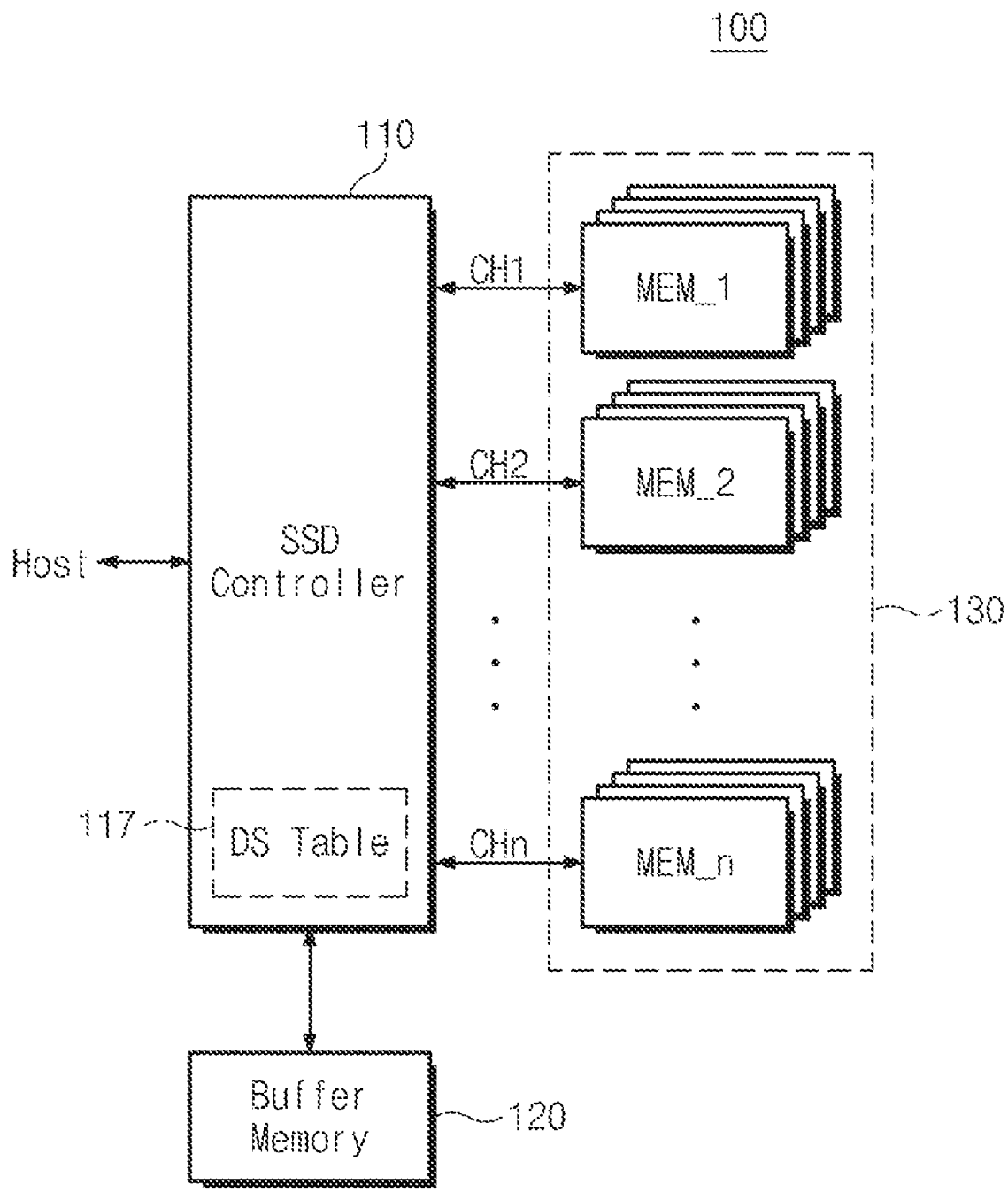
FIG. 1 is a block diagram illustrating a Solid State Drive (SSD) according to an embodiment of the present general inventive concept.

Exemplary embodiments of the present general inventive concept will be described below in more detail with reference to the accompanying drawings. The present general inventive concept may, however, be embodied in different forms and should not be construed as limited to the embodiments set forth herein. Rather, these embodiments are provided so that this disclosure will be thorough and complete, and will fully convey the scope of the present general inventive concept to those skilled in the art. Like reference numerals refer to like elements throughout.

Hereinafter, a Solid State Drive (SSD) will be used as an example of a memory system to explain the features and functions of an embodiment of the inventive concept. However, other features and utilities of embodiments of the present general inventive concept set forth herein will be readily understood by persons skilled in the art. Also, although a NAND flash memory is described as an example of a storage medium, embodiments of the general inventive concept are not limited thereto. For example, memories such as PRAMs, MRAMs, ReRAMs, and NOR flash memories may be used as storage media. Furthermore, an embodiment of the general inventive concept may be applied to a memory system in which different kinds of memory devices are mixed.

The present general inventive concept may be embodied in or applied to other embodiments. In addition, the detailed descriptions may be amended or modified according to viewpoints and applications without departing from the scope, technical idea, and other objects of the present general inventive concept. Hereinafter, exemplary embodiments of the general inventive concept will be described in detail with reference to the accompanying drawings.

FIG. 1 is a block diagram illustrating a Solid State Drive (SSD) 100 according to an embodiment of the present general inventive concept. Referring to FIG. 1, the SSD 100 may include an SSD controller 110, a buffer memory 120, and memory devices 130.

The SSD controller 110 may provide a connection between a host (not shown) and the SSD 100. That is, the SSD controller 110 may provide an interfacing with the SSD 100 according to a bus format of the host. Particularly, the SSD controller 110 may decode a command CMD provided from the host. According to the decoding result, the SSD controller 110 may execute an access operation to the memory devices 130 or the buffer memory 120.

Particularly, the SSD controller 110 may adaptively adjust the signal strength (or drive strength) of a memory channel. Physical characteristics, such as capacitance and impedance, of the channel may vary with the number of the memory devices connected to one memory channel. The physical characteristics of the channel may also vary with temperature. The SSD controller 110 may adjust the drive strength of memory channels CH1, CH2, ..., CHn with reference to information on current temperature Temp_Info. The SSD controller 110 may adjust the drive strength of the memory channels CH1, CH2, ..., CHn with reference to the number of the memory devices connected to the respective memory channels CH1, CH2, ..., CHn. The SSD controller 110 may include a drive strength table 117 to detect the information on the temperature and the number of the memory devices respectively connected to the current memory channels CH1, CH2, ..., CHn and then select an optimum drive strength value. The integrity of data exchanged between the SSD controller 110 and the memory devices 130 can be enhanced by the adjustment of the drive strength.

The drive strength table 117 may store the values of the drive strength (or signal strength) between the SSD controller 110 and the memory devices 130 as a lookup table according to the operating environment. That is, the drive strength table 117 may provide the drive strength of a channel signal that can minimize signal distortion and noises in a memory channel according to the operating channel. For example, the drive strength table 117 may provide the drive strength derived from a test according to the number of the memory devices connected to one memory channel and the temperature of the SSD 100.

Write data provided from the host or data read out from the memory devices 130 are temporarily stored in the buffer memory 120. If data stored in the memory devices 130 are cached by a read request from the host, the buffer memory 120 may support a cache function of directly providing the cached data to the host. In this case, an access to the memory devices 130 does not occur. Generally, the data transfer rate by the bus format (e.g., SATA or SAS) of the host is considerably greater than the data transfer rate of the channels CH1, CH2, ..., CHn in the SSD 100. That is, when the interface bit rate of the host is considerably high, the large-capacity buffer memory 120 may be provided to minimize reduction of performance caused by a difference between bit rates.

The buffer memory 120 may include a synchronous DRAM to provide sufficient buffering for the SSD 100 used as a large-capacity auxiliary memory device. However, it will be apparent to persons skilled in the art that the buffer memory 120 is not limited to that described in this disclosure.

The memory devices 130 may be provided as storage media of the SSD 100. For example, the memory devices 130 may include NAND-type flash memories having large storage capacity. Some or all of the memory devices 130 may include DRAMs or SRAMs that are volatile memories.

The respective memory devices 130 may be connected to the SSD controller 110 through the channels CH1, CH2, ..., CHn. The I/O ports of the memory devices 130 connected to one of the channels CH1, CH2, ..., CHn may share the channel. Hereinafter, flash memories that are storage devices will be described as an example of the memory devices 130. However, the memory devices 130 may include other non-volatile memory devices. For example, PRAMs, MRAMs, ReRAMs, FRAMs, and NOR flash memories may be used as the storage media.

According to the features described above, the SSD 100 may include the SSD controller 110 to adjust the drive strength of a signal according to the current temperature and the number of the memory devices connected to the memory channels. Thus, data integrity can be ensured in a memory channel structure for high integration and modularization.

Figure 2:
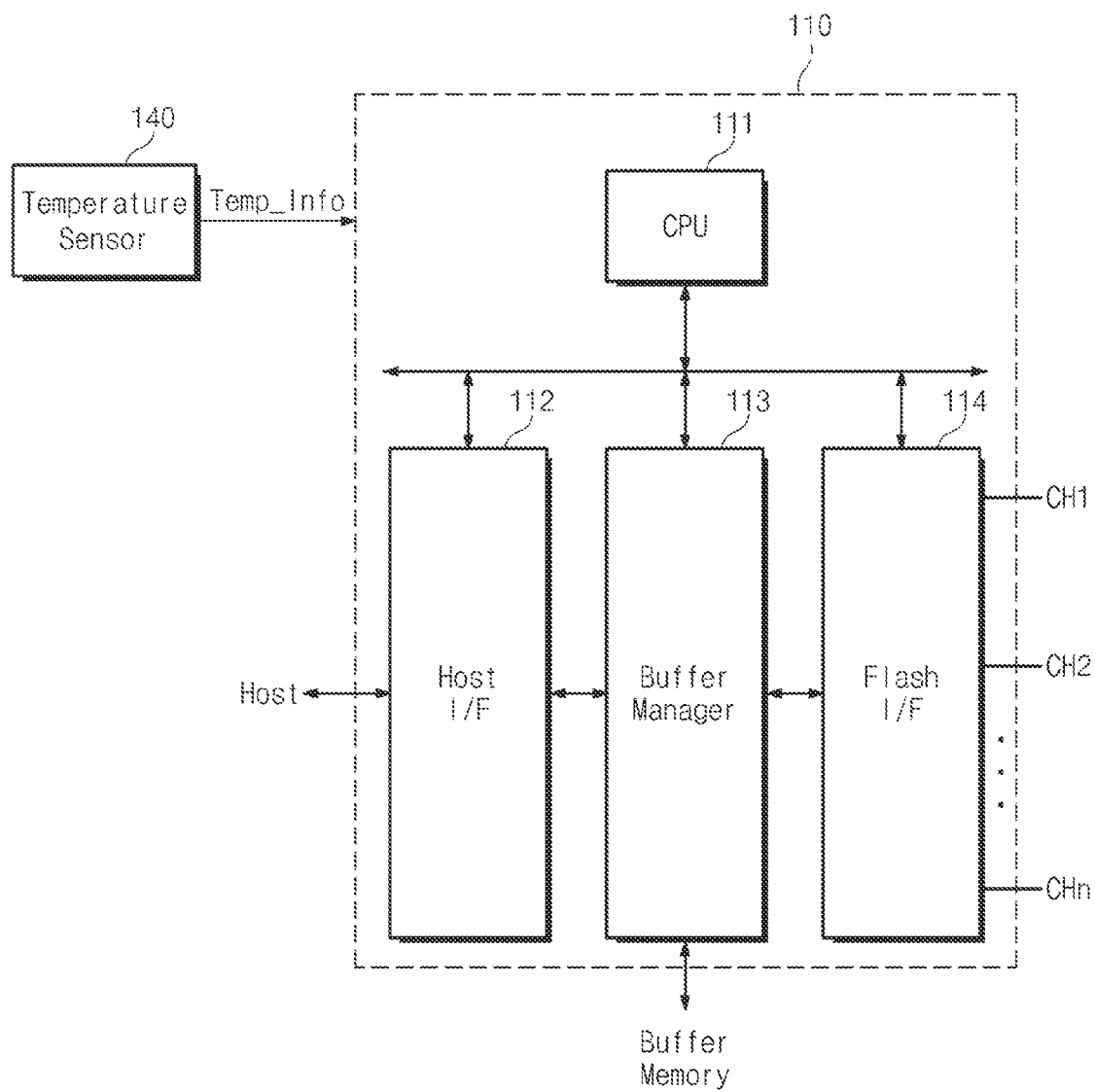
FIG. 2 is a block diagram illustrating an SSD controller of FIG. 1.

FIG. 2 is a block diagram illustrating an SSD controller 110 of FIG. 1. Referring to FIG. 2, the SSD controller 110 may include a Central Processing Unit (CPU) 111, a host interface 112, a buffer manager 113, and a flash interface 114. A temperature sensor 140 may be included in the SSD 100 or the host to provide the temperature information Temp_Info.

The CPU 111 may adjust the drive strength by referring to the temperature information Temp_Info and the number of the memory devices connected to the memory channels. The CPU 111 may input a value of a register (not shown) into the flash interface 114 to set the drive strength of the channel. The CPU 111 may deliver various control information necessary for read/write operations to the host and the registers of the flash interface 114. For example, if a command CMD is inputted from the host or another device external to the SSD controller 110, the command CMD may be stored in a register (not shown) of the host interface 112. The host interface 112 may inform the CPU 111 according to stored commands that the read/write commands were inputted. Such an operation may be performed between the CPU 111 and the flash interface 114. The CPU 111 may control the respective components according to firmware for driving the SSD 100.

The host interface 112 may provide a physical connection between the host and the SSD 100. For example, the host interface 112 may provide an interfacing with the SSD 100 according to the bus format of the host. The bus format of the host may include Universal Serial Bus (USB), Small Computer System Interface (SCSI), PCI express, ATA, Parallel ATA (PATA), Serial ATA (SATA), and Serial Attached SCSI (SAS).

The host interface 112 may support a disk emulation function that allows the host to recognize the SSD 100 as an HDD. For example, a function such as Flash Translation Layer FTL may be provided to hide a delete operation.

The buffer manager 113 may control the read and write operations of the buffer memory (120 of FIG. 1). For example, the buffer manager 113 may store write or read data temporarily in the buffer memory 120.

The flash interface 114 may exchange data with the memory devices 130. The flash interface 114 may scatter data delivered from the buffer memory 120 to the respective memory channels CH1, CH2, . . . , CHn. Data read out from the memory devices 130 provided through the memory channel may be collected by the flash interface 114. Thereafter, the collected data may be stored in the buffer memory 120.

The flash interface 114 may exchange data with the memory devices 130 according to the control of the CPU 111. Particularly, the flash interface 114 may adjust the drive strength of channels electrically connected to the memory devices according to the operating environment. That is, the drive strength according to the operating environment may be inputted into a specific register of the flash interface 114 by the CPU 111. The flash interface 114 may adjust the signal strength of the memory channels CH1, CH2, . . . , CHn according to the drive strength stored in the specific register.

The temperature sensor 140 may measure the temperature at a specific point when the SSD 100 begins to operate. The temperature sensor 140 may deliver the level of the measured temperature to the SSD controller 110 in the form of the temperature information Temp_Info. The position of the temperature sensor 140 is not limited to the inside of the SSD 100. For example, the temperature information measured by the host may be delivered to the SSD controller 110.

According to changes of the operating environment, the flash interface 114 will not be limited only to the adjustment of the drive strength. That is, the bandwidth or interleaving method of the memory channel, or the channel frequency may also be adjusted according to the changes of the operating environment. If the CPU 111 inputs a value of a specific register corresponding to the operating environment into the flash interface 114, the drive strength, channel bandwidth, or way interleaving of the memory channel may be adjusted. The channel bandwidth means the number of activated channels among the memory channels CH1, CH2, . . . , CHn. The way interleaving means the number of the memory devices allowed for an interleaving access in the activated memory channel.

Also, channel skew allowing different data transfer timings of the respective activated memory channels according to the changes of the operating environment may be set. Channel driving conditions may be variable according to the changes of the operating environment. For convenience of explanation, however, only the drive strength of the channel will be described below.

Figure 3:
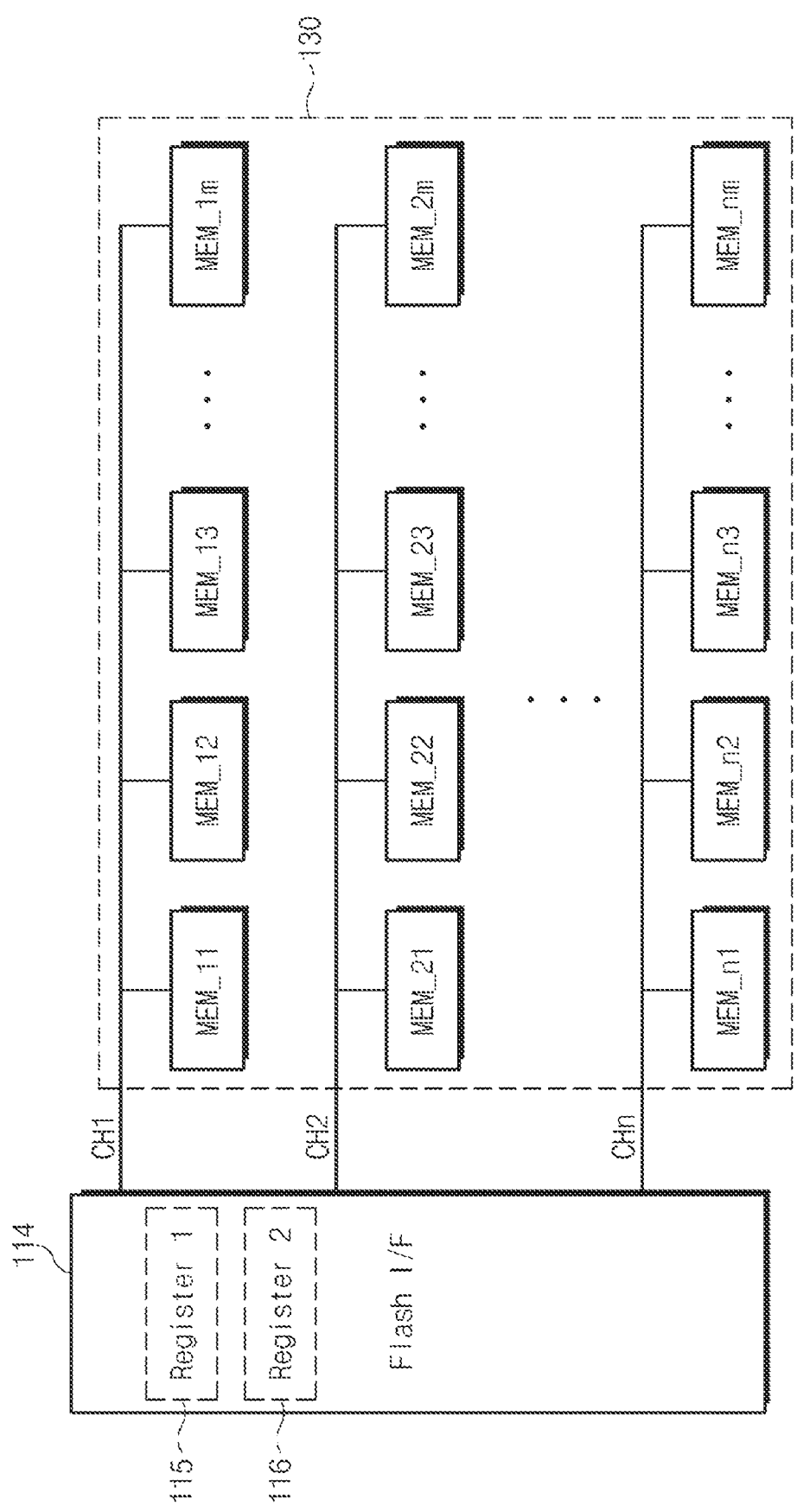
FIG. 3 is a block diagram illustrating a flash interface of FIG. 2 and memory devices.

FIG. 3 is a block diagram illustrating the memory devices 130 controlled by the flash interface 114 of FIG. 2. Referring to FIG. 3, the flash interface 114 may be connected to the memory devices 130 through the plurality of memory channels CH1, CH2, . . . , CHn.

I/O ports (for example, 8-bit I/O pin) of m (m is a natural number) memory devices MEM_11, MEM_12, . . . , MEM_1m are connected to the first channel CH1. The memory devices MEM_21, MEM_22, . . . , MEM_2m may share the second channel CH2. Similarly, I/O ports of m memory devices MEM_n1, MEM_n2, . . . , MEM_nm may also be connected to the n-th channel CHn.

The flash interface 114 may transmit a signal to a bus line including the respective memory channels CH1, CH2, . . . , CHn to exchange data with the memory device 130. The signal provided from the flash interface 114 to the bus line may be distorted by temperature. The signal provided from the flash interface 114 to the bus line may be distorted by the number of the memory devices connected to one memory channel. That is, the impedance (Z) or capacitance (C) of the bus line according to the temperature and the number of the memory devices may be varied. In order to prevent an error caused by a distortion, it is necessary to adjust the signal strength to drive the bus line according to the change of the impedance (Z) and capacitance (C).

Accordingly, drive strength registers 115 and 116 may be included in the flash interface 114 to drive the bus line at the signal strength to minimize the distortion. Level information of optimum signal strength corresponding to the number of the memory devices connected to the respective memory channels may be recorded in the drive strength register 115. Level information of optimum signal strength capable of minimizing the distortion at the current temperature may be recorded in the drive strength register 115. The flash interface 114 may adjust the signal strength applied to the bus line of the memory channels by referring to values set in the drive strength registers 115 and 116. The flash interface 114 may exchange data with the memory devices 130 according to the level corresponding to the adjusted signal strength.

Here, it has been described that the drive strength registers 115 and 116 are set according to the temperature and the number of the memory device connected to each channel. However, the driving strength register 115 is first set by referring to the number of the memory devices connected to each channel, and then the drive strength register 116 corresponding to the current temperature under may be set to achieve a finer adjustment of the drive strength.

Also, it has been described that only the drive strength registers 115 and 116 for adjusting the drive strength are included in the flash interface 114. However, the flash interface 114 may further include registers for adjusting the channel bandwidth and the number of memories for a way interleaving, and the channel skew.

The drive strength of all memory channels CH1, CH2, . . . , CHn may be in a lump set by the setting of the drive strength registers 115 and 116. Alternatively, drive strength registers corresponding to the respective memory channels CH1, CH2, . . . , CHn may be provided to individually set the drive strength of the respective memory channels CH1, CH2, . . . , CHn. A correspondence relation between the drive strength register and the memory channel may be variously modified or expanded.

For example, the SSD controller 110 may determine a total number of memory devices 130 connected to all of the channels CH1 . . . CHn and may adjust the drive strength registers 115 and 116 accordingly. Alternatively, the controller 110 may determine a maximum number of memory devices connected to any one channel, or an average number of memory devices connected to each channel, and may adjust the drive strength of all of the channels CH1 . . . CHn accordingly. Alternatively, the controller 110 may determine a number of memory devices connected to each separate channel CH1 . . . CHn and may adjust a drive strength supplied to each channel separately. Separate channels may receive different drive voltages by using a switching circuit to supply multiple voltages, by using multiple registers to supply different voltages to respective channels, by sequentially accessing different channels, or by any other appropriate method.

Figure 4A:
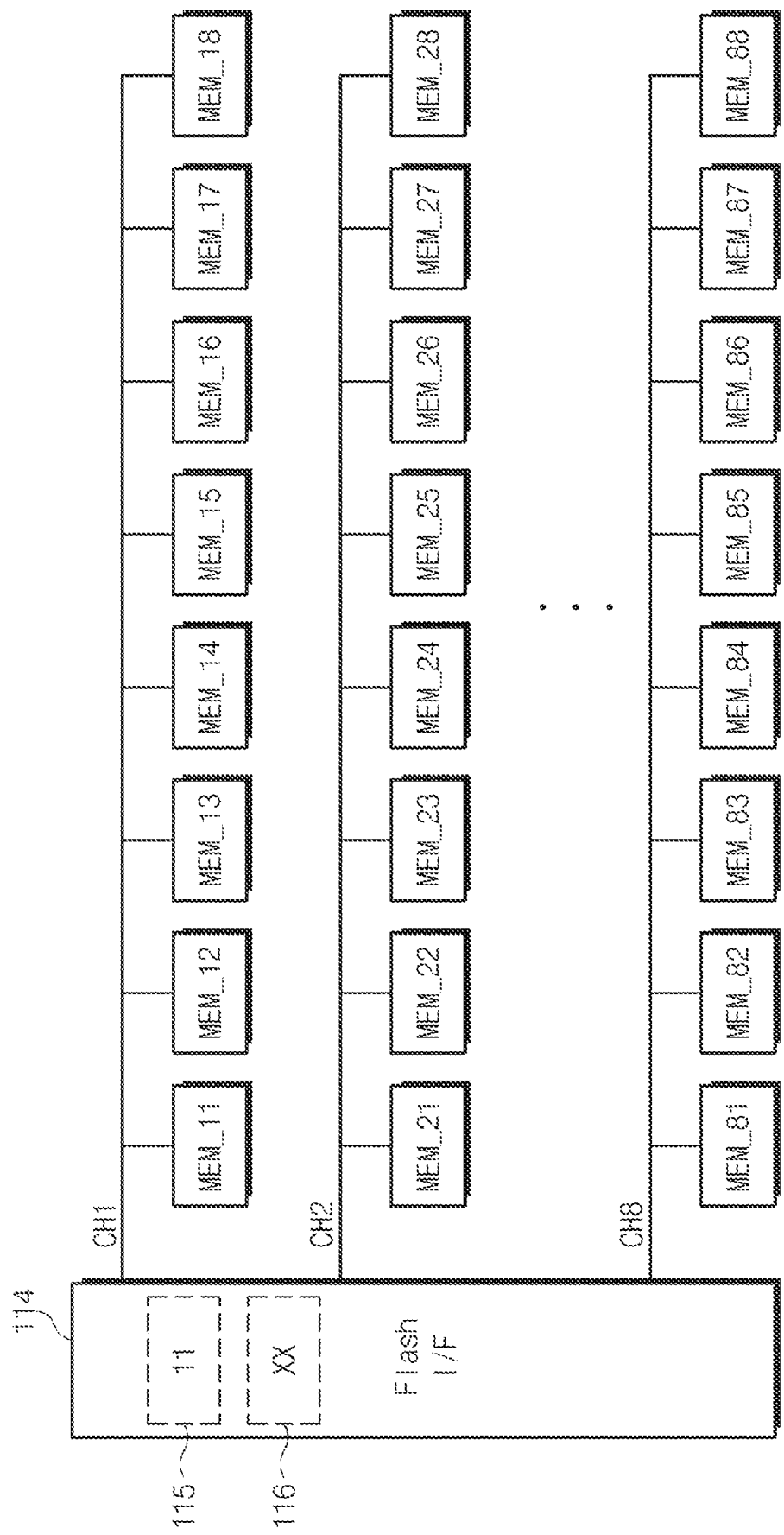
FIGS. 4A, 4B, and 4C are block diagrams illustrating a method of setting a drive strength register of FIG. 3.
Figure 4B:
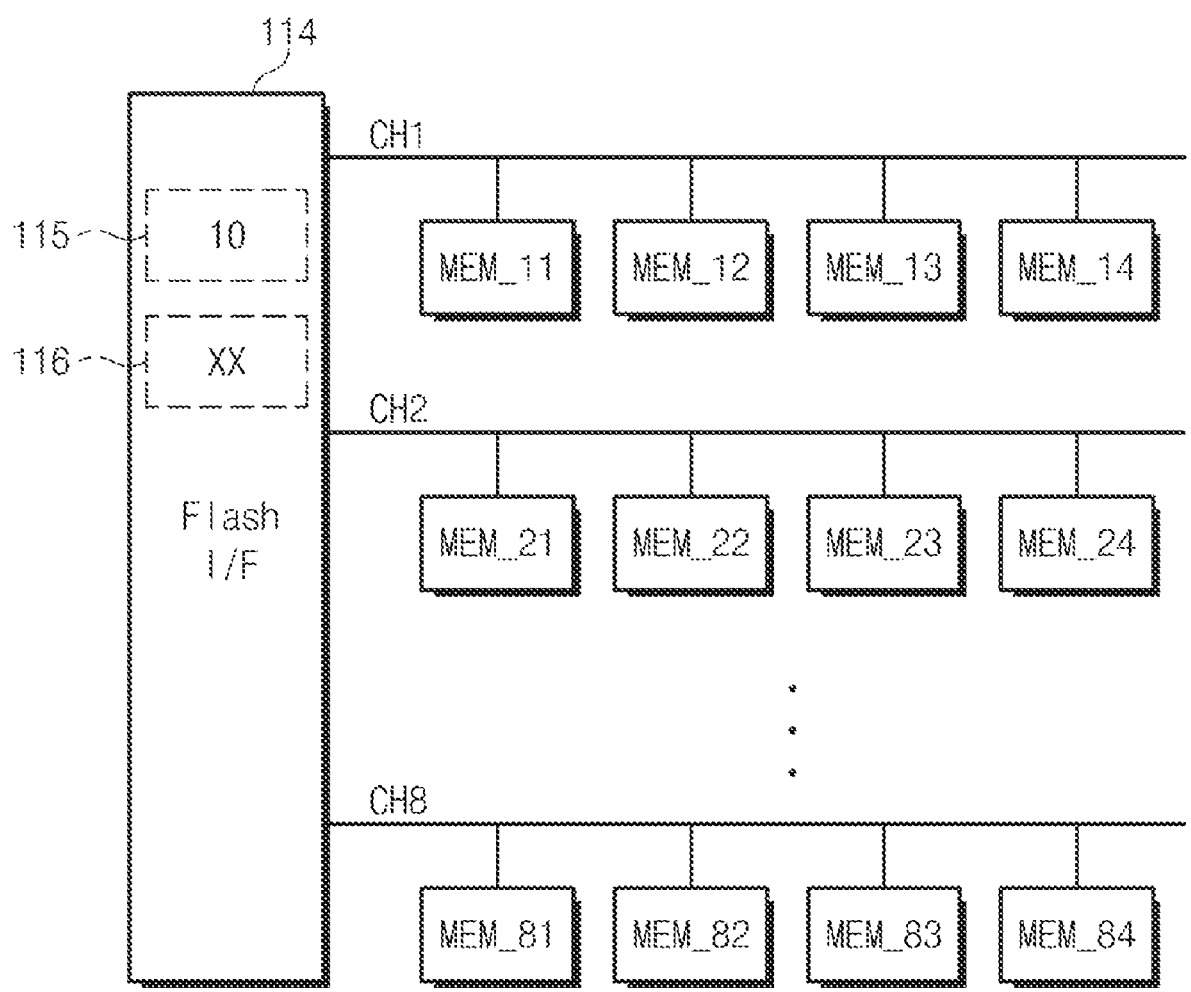
Figure 4C:
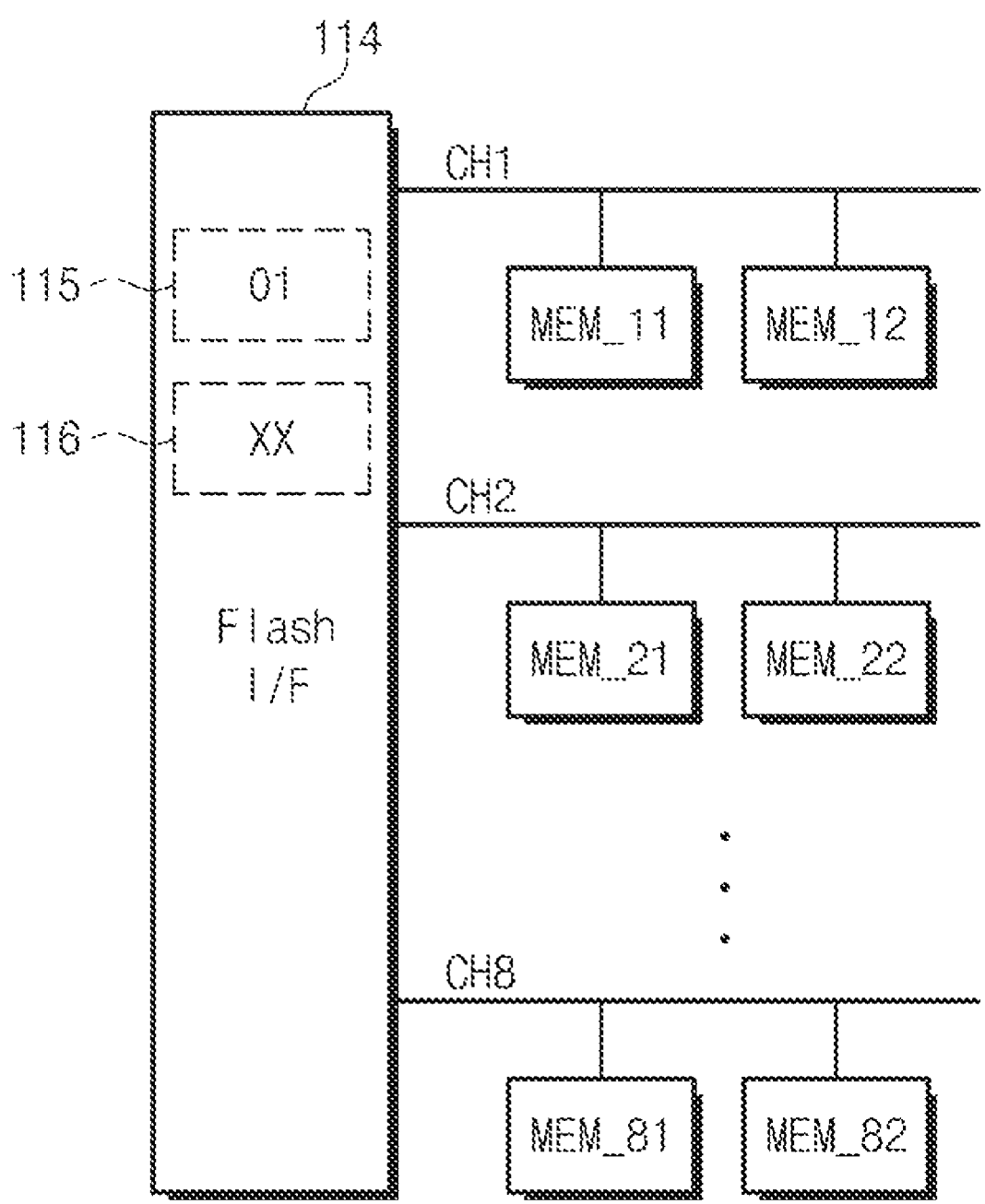

FIGS. 4A, 4B, and 4C show that a value of the drive strength register 115 is changed according to the number of the memory devices connected to each channel. FIG. 4A shows that eight memory devices are connected to one memory channel. In this case, the logic '11' may be inputted into the drive strength register 115 by the CPU (111 of FIG. 2). Since the drive strength register 116 is changed according to the temperature, detailed description thereof will be made with reference to FIGS. 5A and 5B. Accordingly, the value of the drive strength register 116 will be assumed to be in a don't-care state. FIG. 4B shows that four memory devices are connected to one memory channel. In this case, the logic '10' may be inputted into the drive strength register 115 by the CPU 111. FIG. 4C shows that two memory devices are connected to one memory channel. In this case, the logic '01' may be inputted into the drive strength register 115 by the CPU 111.

As described above, different values are set in the drive strength register 115 according to the number of the memory devices. That is, as the number of the memory devices connected to the memory channel increases, the bus line needs to be driven at greater signal strength. The flash interface 114 may control a drive current of a driver (not shown) of the memory channel to adjust the signal strength.

Figure 5A:
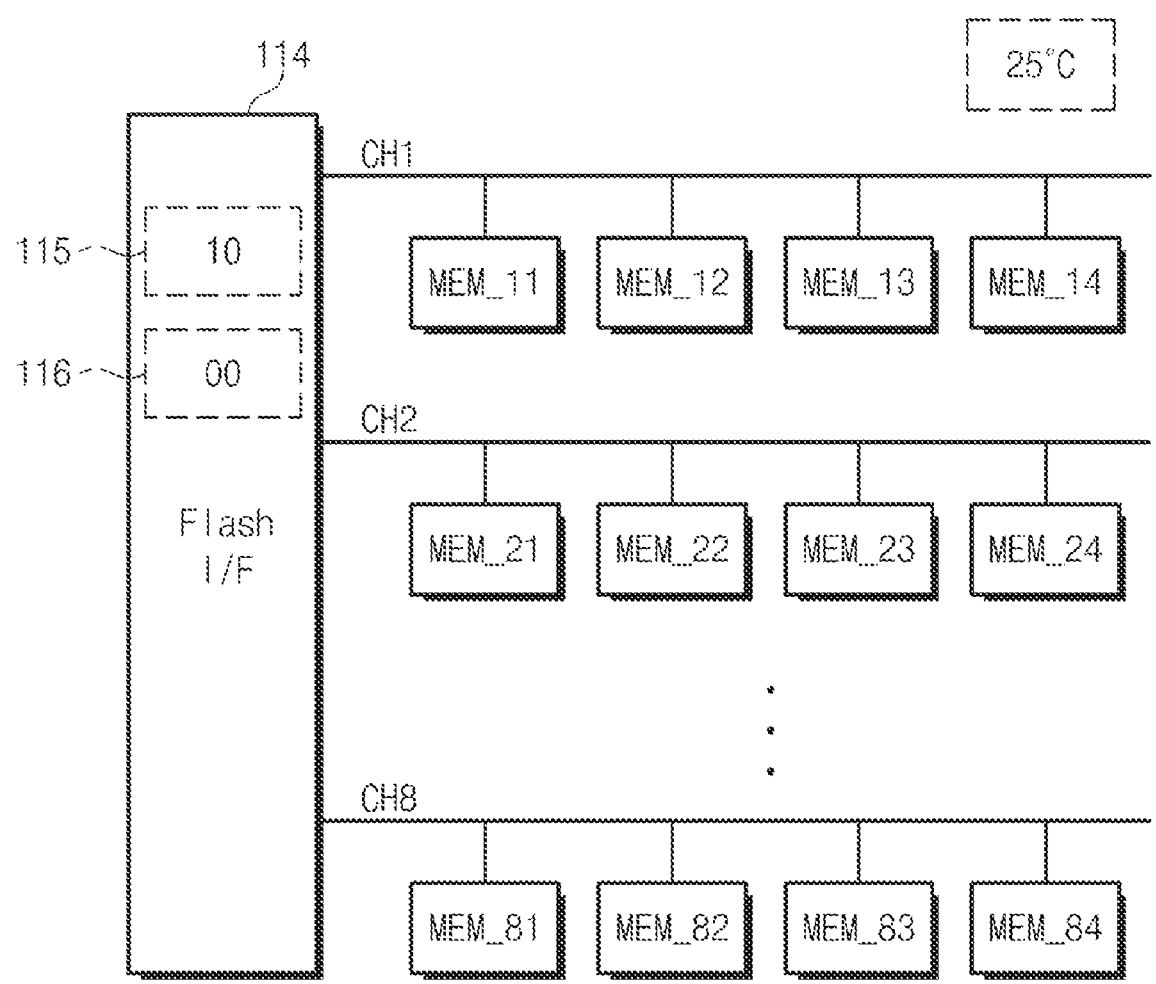
FIGS. 5A and 5B are block diagrams illustrating another method of setting a drive strength register of FIG. 3.
Figure 5B:
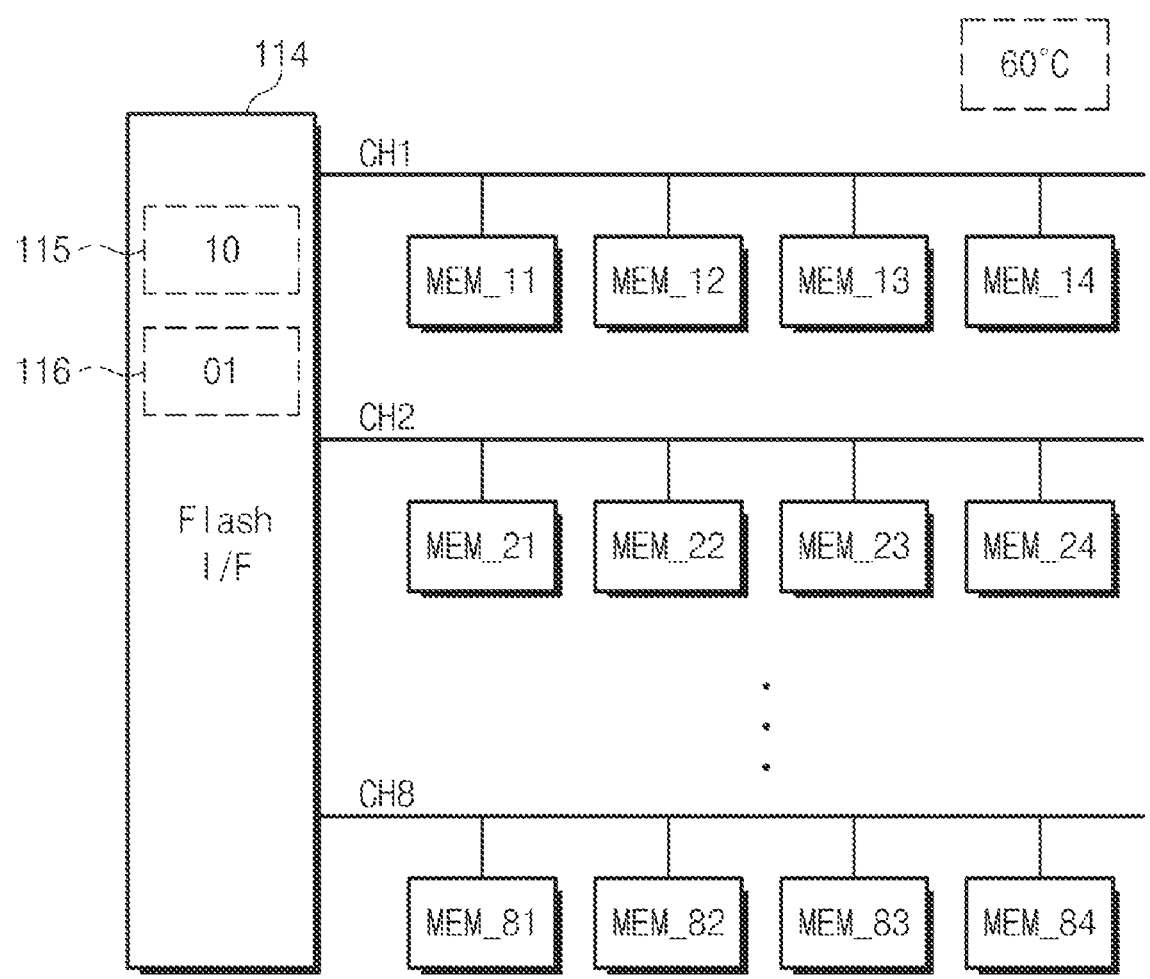

FIGS. 5A and 5B are block diagrams illustrating the drive strength register 116 adjusted by the temperature. Referring to FIG. 5a, when the internal temperature of the SSD is about 25° C., such temperature information may be provided to the SSD controller 110. Then, the logic '00' may be inputted into the drive strength register 116 by the CPU 111. Here, it will be assumed that the number of the memory devices connected to one memory channel is four. The flash interface 114 may adjust the signal strength for driving the bus lines of the memory channels by referring to the values of the drive strength registers 115 and 116.

FIG. 5B shows that, when the internal temperature of the current SSD is about 60° C., the setting of the drive strength register 116 is modified. When the temperature information is provided to the SSD controller 110, the logic '01' may be inputted into the drive strength register 116. Then, the flash interface 114 may adjust the signal strength for driving the bus lines of the memory channels by referring to the values of the drive strength registers 115 and 116.

The internal temperature of the SSD 100 may be variable according to changes of the operating environment. Accordingly, the firmware of the SSD controller 110 may be configured such that the value of the drive strength register 115 may be set only at an initial booting operation, and the value of the drive strength register 116 may be reset when the temperature variation is beyond a specific level during the operation thereof.

Figure 6:
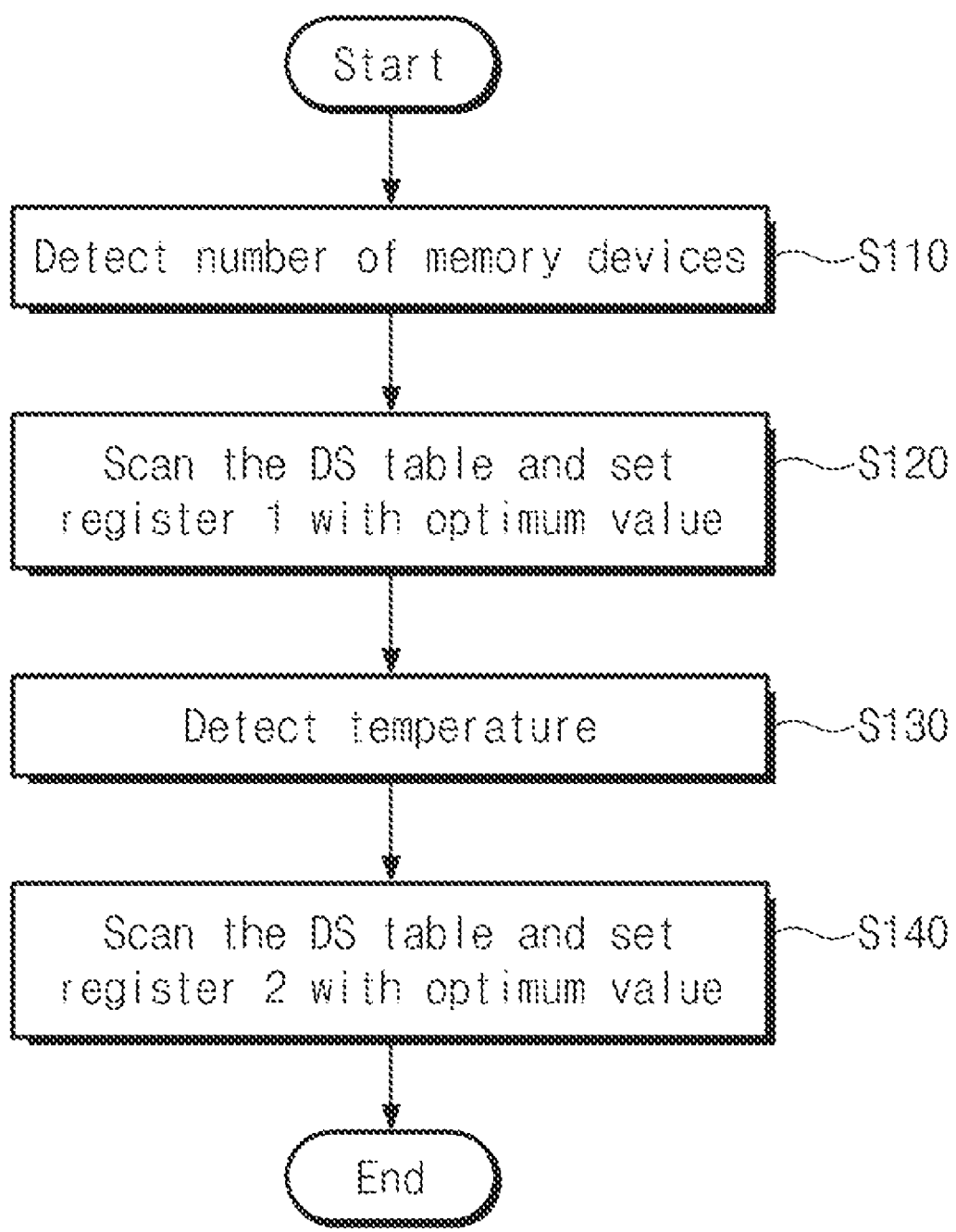
FIG. 6 is a flowchart illustrating a method of setting a drive strength.

FIG. 6 is a flowchart illustrating a method of setting the drive strength registers 115 and 116. Referring to FIG. 6, a method of setting drive strength will be described in detail with reference to FIG. 6.

If power is supplied to the SSD 100 by booting of a system equipped with the SSD 100, overall processes for setting the drive strength of memory channels begin. First, the SSD controller 110 may count the number of the memory devices connected to the respective memory channels. A method for counting the number of the memory devices connected to the respective memory channels may be variously modified according to the configuration of the memory devices. For example, when the memory devices are configured in a form of a multi-chip package, the SSD controller 110 may access memory packages connected to the respective channels to read ID information. In operation S110, the SSD controller 110 may detect the capacity and number of the memory devices included in the packages using the ID information of the packages.

If the number of the memory devices connected to each memory channel is counted, the CPU 111 may retrieve a value of the drive strength register from a drive strength table. The CPU 111 may record the detected value of the drive strength register in the drive strength register 115 of the flash interface 114. In operation S120, the setting operation of the drive strength of the memory channel that is performed by referring to the number of the memory devices.

Subsequently, a procedure to control the signal strength of the memory channel according to the temperature may be performed. The SSD controller 110 may receive current temperature information Temp_Info from at least one temperature sensor equipped at a specific position of the SSD. The SSD controller 110 may detect temperature at which all components of the SSD 100 operate. In operation S130, the current temperature information Temp_Info may be provided from the host.

If the detection of the temperature is completed, the CPU 111 may retrieve a value of the drive strength register corresponding to the detected temperature from the drive strength table. The CPU 111 may record the acquired value of the drive strength register in the drive strength register 116 of the flash interface 114. If the setting of the drive strength register 116 is completed, the procedure for setting the drive strength of the memory channel is completed in operation S140.

As the drive strength registers 115 and 116 are completed, the flash interface 114 may drive the memory channel at the drive strengths corresponding to the values of the drive strength registers 115 and 116.

Although not described in the foregoing flowchart, the SSD controller 110 may continuously detect whether the temperature measured in the preceding operation is changed into temperature requiring an adjustment of the drive strength. That is, the SSD controller 110 may be configured to continuously monitor the temperature information Temp_Info provided from the temperature sensor.

If the temperature information Temp_Info being monitored indicates temperature variation that does not require an adjustment of the drive strength, the procedure may be moved to an operation to monitor the temperature information Temp_Info continuously. On the other hand, if the temperature information Temp_Info being monitored indicates temperature variation that requires an adjustment of the drive strength, the procedure may be moved to an operation to reset the drive strength register 116 by retrieving a value of the drive strength register corresponding to currently-measured temperature. Such an operation loop to monitor the temperature information Temp_Info to update the value of the drive strength register 116 may be continuously performed until power is shut off.

Figure 7:
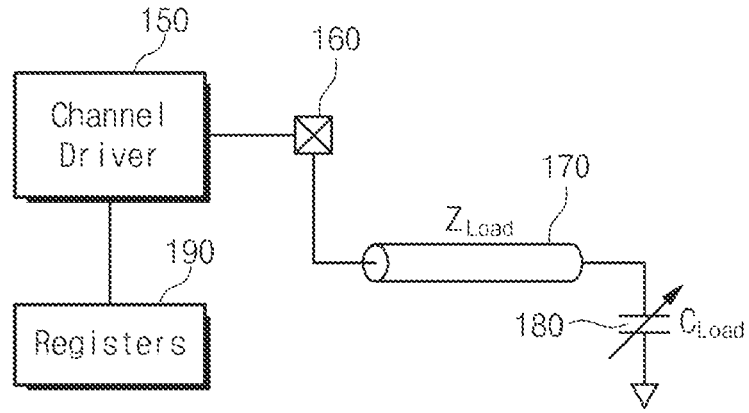
FIG. 7 is a circuit diagram illustrating a modeling of channel characteristics according to the number of memory devices connected to a memory channel.

FIG. 7 is a circuit diagram illustrating a simple modeling of a channel driver 150 and channels and memory device 130. FIG. 7 is a circuit diagram illustrating a simple modeling of one memory channel and load capacitance ($C_{load}$) variable with the number of the memory devices connected to the memory channel.

The channel driver 150 may output a signal to an output terminal at drive strength corresponding to data provided from the drive strength registers 190.

The drive strength registers 190 may be configured in a similar way to that of the drive strength registers 115 and 116. The memory channel and the memory devices may be modeled in an output terminal 160, impedance ($Z_{load}$) 170, and load capacitance ($C_{load}$) 180. The impedance ($Z_{load}$) 170 refers to a distribution impedance determined by a bus line constituting memory channels from the output terminal 160. The load capacitance ($C_{load}$) 180 refers to a capacitance variable with the number of the memory devices connected to one memory channel. Here, the impedance ($Z_{load}$) 170 and the load capacitance ($C_{load}$) 180, which are values viewed from the side of the output terminal 160 may be considered not values determined by a specific device or component but distributed constants.

Based on such a modeling, signal characteristics viewed from the output terminal 160 toward the memory channel are determined by a time constant T. The time constant T corresponds to the impedance ($Z_{load}$) times the load capacitance ($C_{load}$) ($T = Z_{load} \times C_{load}$).

Figure 8:
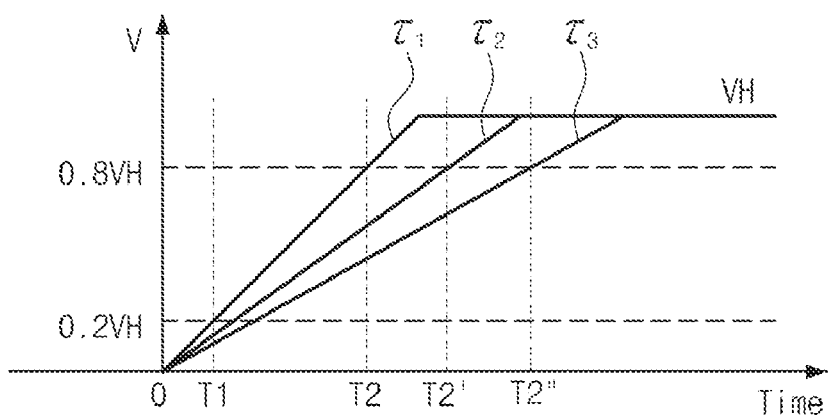
FIG. 8 is a timing diagram illustrating the response characteristics of a memory channel according to a change of a time constant of FIG. 7.

FIG. 8 is a timing diagram illustrating the response characteristics of a memory channel according to a change of the time constant T of FIG. 7. Signal drive characteristics showing at the output terminal 160 according to the change of the time constant T are briefly shown in the timing diagram.

When the number of the memory devices connected to the memory channel is smallest, and thus the load capacitance ($C_{load}$) is smallest, the channel response characteristics are shown by the characteristic curve corresponding to the smallest time contact T1. Looking at the characteristic curve corresponding to the time contact T1, time T2 is required until the signal of the channel reaches the level of about 80% (0.8VH) of a target voltage. In case of the time contact T1, the response speed is relatively high.

The response characteristic curve corresponding to the time contact T2 shows a case where the number of the memory devices connected to the memory channel is greater than that in the time contact T1. According to the response characteristic of the memory channel in the time contact T2, time T2' is required until the signal of the channel reaches the level of about 80% (0.8VH) of a target voltage. In this case, the required time T2' is greater than the required time T2.

The response characteristic curve corresponding to the time contact T3 shows a case where the number of the memory devices connected to the memory channel is greater than that in the time contact T2. According to the response characteristic of the memory channel in the time contact T3, time T2" is required until the signal of the channel reaches the level of about 80% (0.8VH) of a target voltage. In this case, the required time T2" is greater than the required time T2'.

If the number of the memory devices connected to one memory channel increases, then the time constant T increases, and the response speed of the channel is reduced in the drive characteristics of the memory channel. However, if the time constant T is excessively reduced, the response speed of the channel increases, but power consumption increases. Accordingly, the trade-off of the power consumption and the response speed needs to be optimized according to the change of the time constant T.

Figure 9:
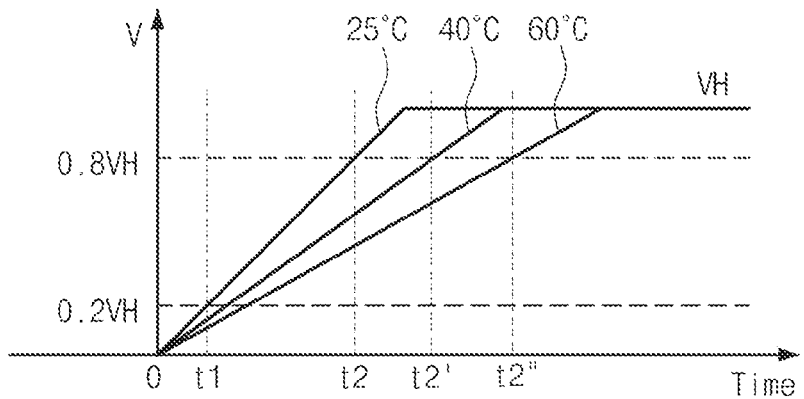
FIG. 9 is a timing diagram illustrating a change of characteristics of a signal according to a temperature change.

FIG. 9 is a timing diagram illustrating a change of characteristics of a signal according to a temperature change. The timing diagram of FIG. 9 shows signal characteristics viewed from the output terminal 160 according to the change of the temperature when the same drive strength is provided.

Looking at the curve showing the drive characteristics of the memory channel at a temperature of about 25° C., time t2 is required at the temperature of about 25° C. until the signal of the channel reaches the level of about 80% (0.8VH) of a rising target voltage. Looking at the curve showing the drive characteristics of the memory channel at a temperature of about 40° C., time t2 is required at the temperature of about 40° C. until the signal of the channel reaches the level of about 80% (0.8VH) of a rising target voltage. Looking at the curve showing the drive characteristics of the memory channel at a temperature of about 60° C., time t2" is required at the temperature of about 60° C. until the signal of the channel reaches the level of about 80% (0.8VH) of a rising target voltage.

The response characteristics of the memory channel as well as the time constant T are changed according to the temperature. Accordingly, the drive strength of the channel may be adjusted according to the number of the memory devices connected to each channel, and then the drive strength of the memory channel may be adjusted according to the change of temperature. Thus, a finer setting of the drive strength can be achieved. In this case, reliability between the flash interface 114 and the memory devices and efficiency of power consumption can be enhanced.

Figure 10:
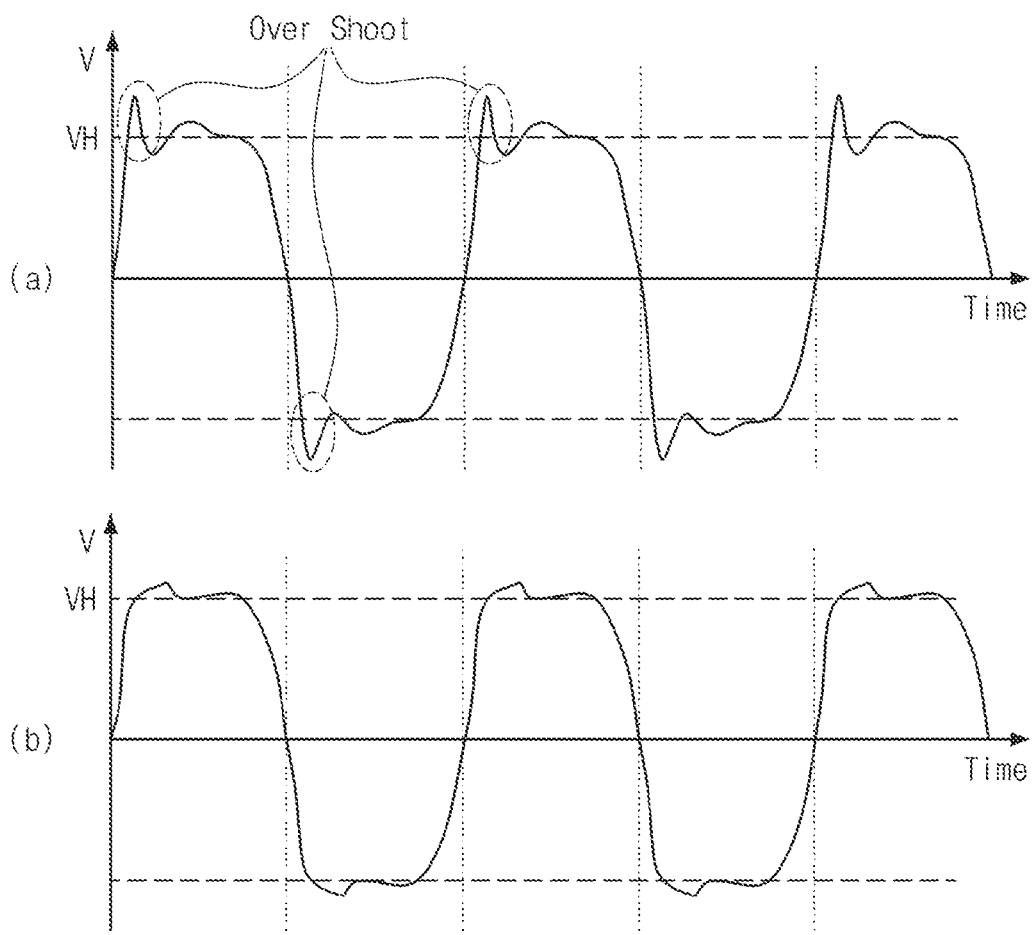
FIG. 10 is a waveform diagram illustrating characteristics of a memory channel optimized according to the adjustment of drive strength.

FIG. 10 shows a waveform of a signal when inappropriate drive strength of a memory channel is set and a waveform after the adjustment of drive strength. When the drive strength of the memory channel is excessively high, a limitation by an over-shoot may be caused. For example, the over-shoot may be generated when the number of the memory devices connected to the memory channel having fixed drive strength is relatively small. The waveform diagram (a) shows the above limitation, and the waveform diagram (b) shows that a stable waveform can be obtained when the drive strength is appropriately adjusted in such a situation. In order to adjust the drive strength, for example, a method of reducing the amount of the supply current may be used. However, the adjustment of the drive strength of a channel driver is not limited only to the adjustment of the supply current.

Figure 11:
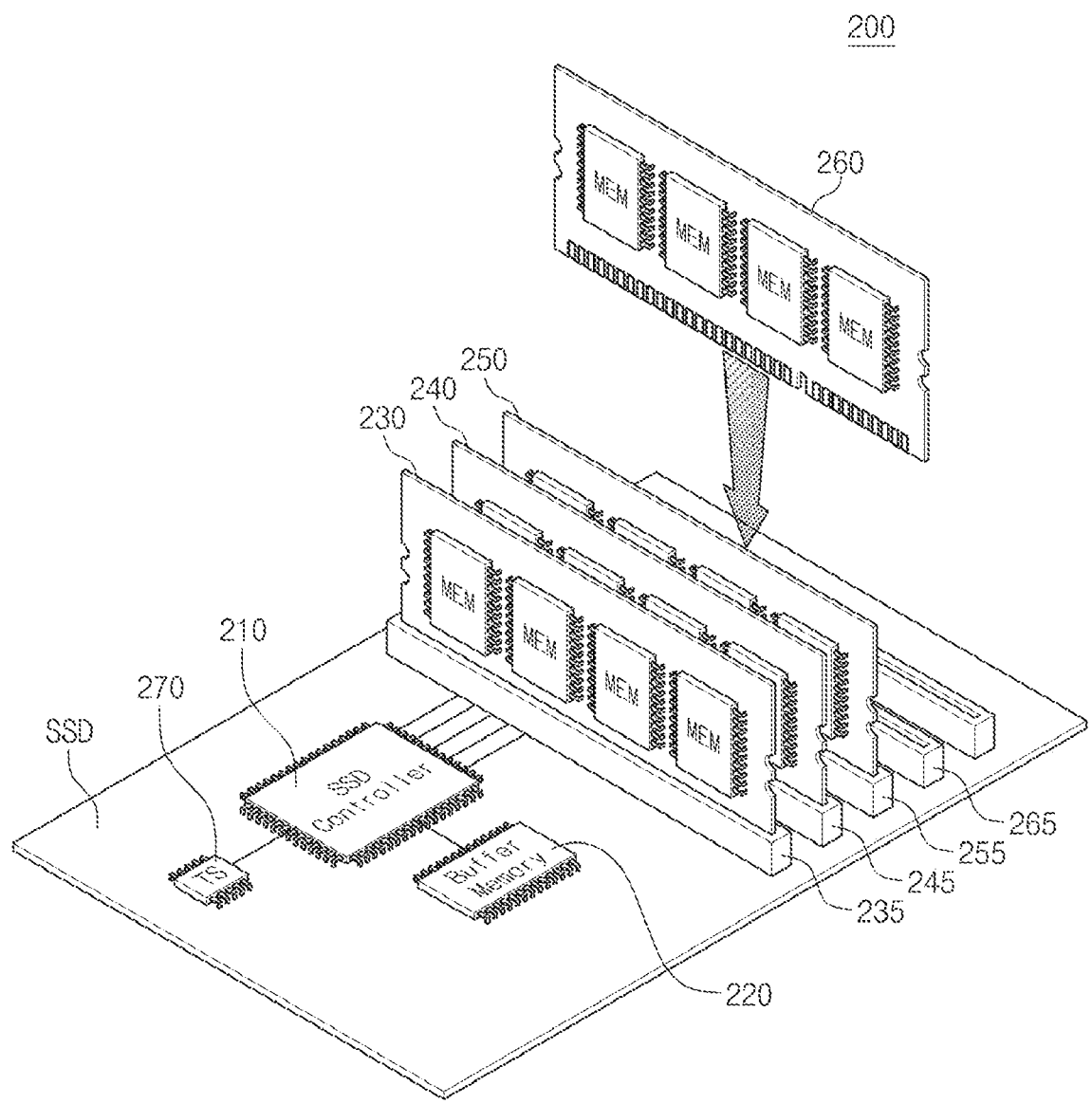
FIG. 11 is a diagram illustrating an SSD having a modularized memory device according to an embodiment of the present general inventive concept.

FIG. 11 shows an example of a storage device to which the adjustment of the drive strength according to an embodiment may be efficiently applied. Referring to FIG. 11, the technical features according to an embodiment may be advantageous for an SSD in which components are modularized. That is, an SSD controller 210 where the drive strength can be adjusted according to an embodiment may be applied to an SSD 200. When the configuration of the SSD 200 is modularized, expansion of capacity or updates of performance may be better facilitated. In a structure having all components fixed on one substrate, the expansion of capacity or the updates of performance will be limited. However, the SSD controller 210 may be fixed on the substrate, and other components (for example, non-volatile memory devices and buffer memory) may be modularized. As described above with respect to FIG. 1, the SSD controller 210 may be connected to a buffer memory 220 to temporarily store data before transmitting the data to or from the memory devices 230, 240, 250, and 260.

The SSD controller 210 may be equipped with an algorithm to adjust the drive strength of the memory channel. The SSD controller 210 may count the number of the memory chips or units connected to the channel or refer to the temperature information Temp_Info delivered from the temperature sensor 270 to set the drive strength of the memory channel. Memory devices 230, 240, 250, and 260 may be provided as a memory module that is modularized by a unit of a plurality of non-volatile or volatile memory devices. For example, the memory devices 230, 240, 250, and 260 may be provided in a form of a Single Inline Memory Module (SIMM) or a Dual Inline Memory Module (DIMM). A user may mount the memory modules 230, 240, 250, and 260 into the expansion slots 235, 245, 255, and 265 to expand the storage capacity of the SSD 200. The expanded memory capacity may be recognized by the SSD controller 210 upon booting according to the procedure of FIG. 6 described above. The SSD controller 210 may refer to the temperature sensor 270 and the number of the memory devices connected to each channel to adjust the signal strength for driving the memory channel.

Figure 12:
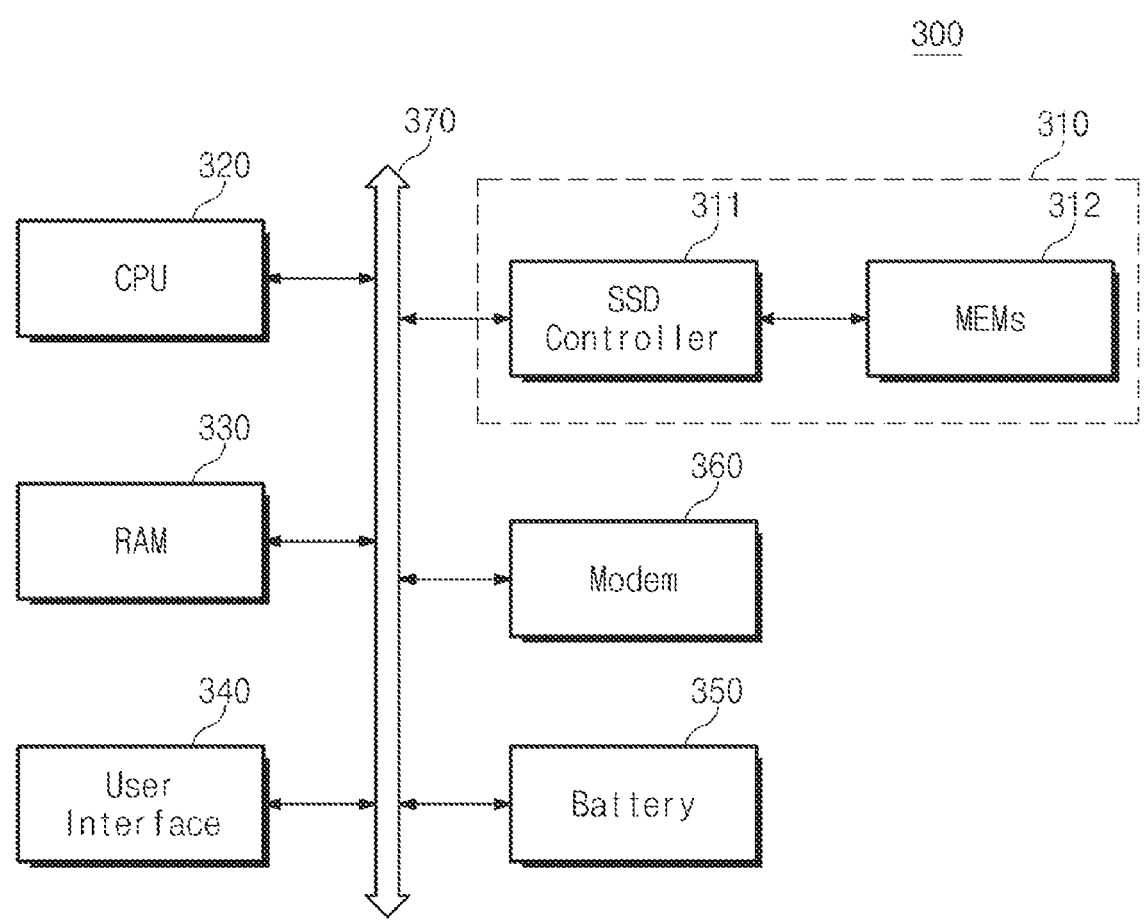
FIG. 12 is a block diagram illustrating a computing system according to an embodiment of the present general inventive concept.

FIG. 12 is a block diagram illustrating a computing system equipped with an SSD according to an embodiment. A computing system 300 may include a micro processor or CPU 320, a RAM or other memory 330, a user interface 340, a battery or power supply 350, a modem or other external device interface 360, and an SSD 310, which are electrically connected to a system bus 370. The SSD 310 may include an SSD controller 311 and a memory device 312. N-bit data (N is a positive integer) processed or to be processed by the microprocessor 320 may be stored in the memory device 312 through the SSD controller 311. Although not shown in the drawing, it will be apparent to persons skilled in the art that the computing system 300 may further include an application chipset, a Camera Image Processor (CIS), a mobile DRAM, and any other functional units specific to a particular computing system.

The SSD 310 may further include a Multimedia Card (MMC), a Secure Digital (SD) Card, a micro SD card, a memory stick, an ID card, a PCMCIA card, a chip card, a USB card, a smart card, a Compact Flash (CF) card.

The memory device 312 may include a flash memory device that can retain stored data even when powered off. As the usage of cellular phones, PDA digital cameras, portable game consoles, and mobile devices such as MP3s increases, flash memory devices are being widely used as code storages as well as data storages. The SSD 310 including the memory device 312 and the SSD controller 311 may be used in home applications such as HDTVs, DVDs, routers, and GPS.

The SSD 310 may be applicable to an embedded system. The embedded system, which is mounted into another device as a part thereof, may perform only computing tasks of specific purposes imposed on the device including the same. For this, the embedded system may require a central processing unit and an operating system, and run applications using the operating system to perform specific tasks. Generally, the embedded system may be mounted to control military appliance, industrial appliance, communication appliance, and home appliance such as set-top boxes, DTVs, and digital cameras.

Figure 13A:
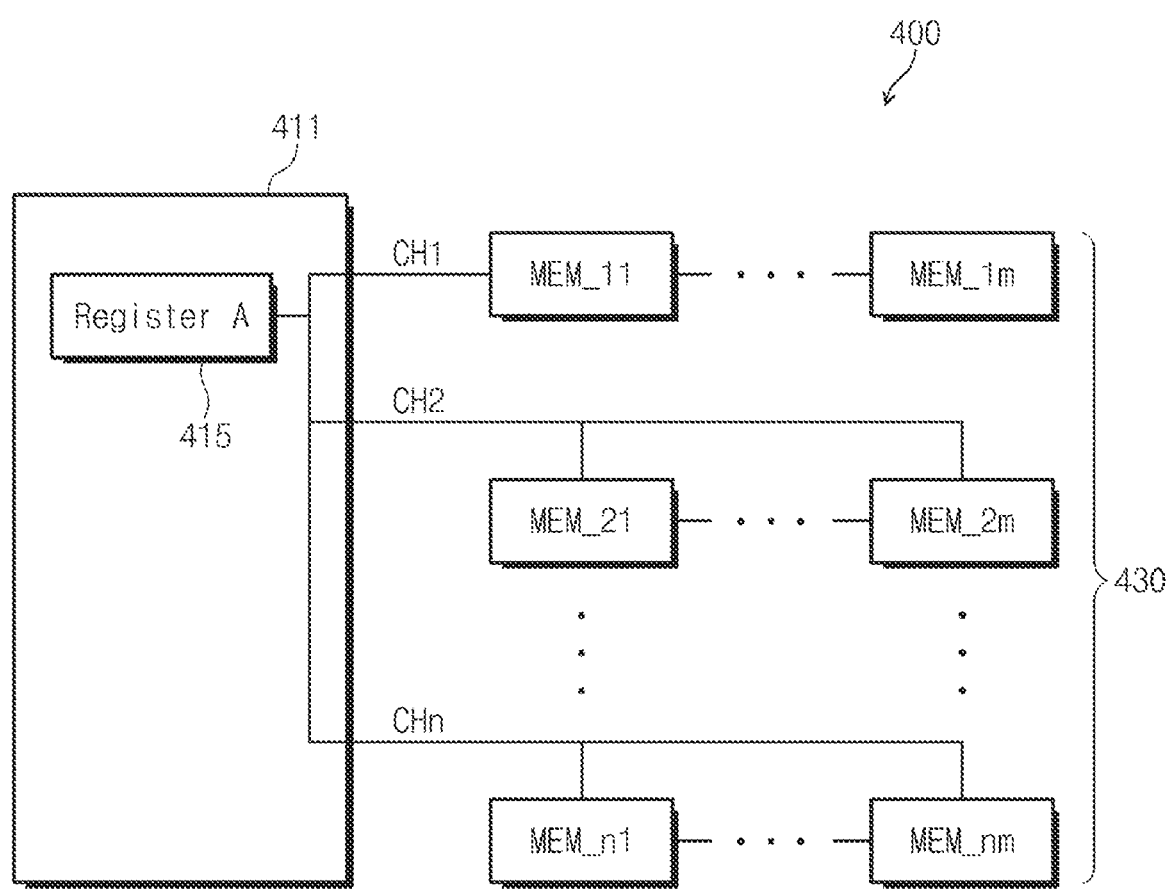
FIGS. 13A and 13B illustrate solid state drives according to embodiments of the present general inventive concept.

FIG. 13A illustrates an SSD 400 including a memory device interface 411 and memory 430 according to an embodiment of the present general inventive concept. The SSD 400 is similar to the flash interface 114 and memory 130 illustrated in FIG. 3.

The memory device interface 411 may include a single register A 415 to control a drive output to each channel CH1, CH2, and CHn of the memory 430. In such a case, the controller (not shown) may determine a total number of memory devices included in the memory 430, an average number of memory devices per channel, a highest number of memory devices per channel, or any other criteria, and may adjust the contents of the register A 415 to correspond to the detected criteria. The contents of the register A 415 may then be used to drive each channel CH1, CH2, and CHn.

Figure 13B:
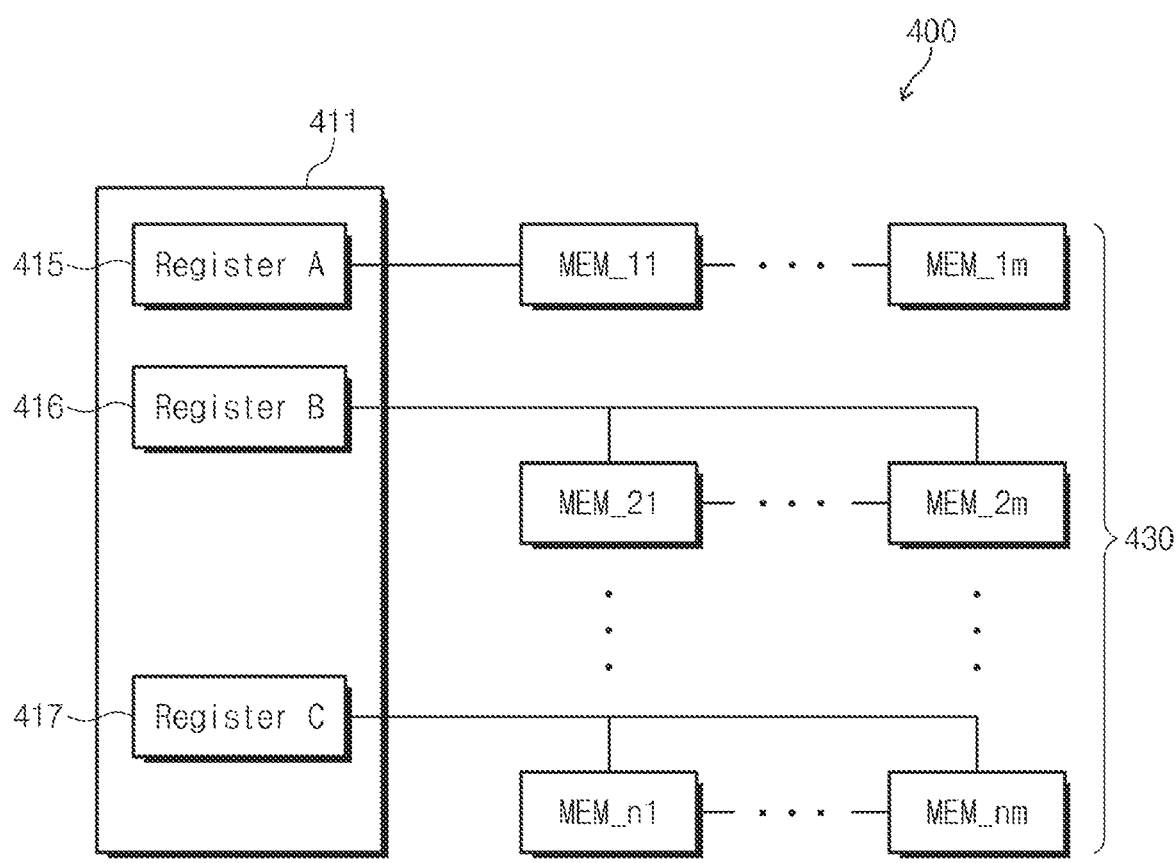

Alternatively, as illustrated in FIG. 13B, the memory device interface 411 may include a plurality of registers 415, 416, and 417 to output separate drive signals to each channel CH1, CH2, and CHn. In such a case, the controller (not shown) may determine a number of memory devices that corresponds to each separate channel and may adjust the contents of the register that corresponds to the channel accordingly. As a result, each channel may simultaneously receive a different drive signal.

According to yet another alternative, a predetermined number of registers may be provided to supply a predetermined number of different drive voltages. A switching circuit may then be used to control access of each channel to a respective register. For example, a circuit may be designed to output up to four different drive voltages simultaneously by including four different drive signal registers. The controller could detect a number of memory devices corresponding to each channel, and could associate the channel with a corresponding register by turning on and off switches between the memory devices and the registers.

Figure 14:
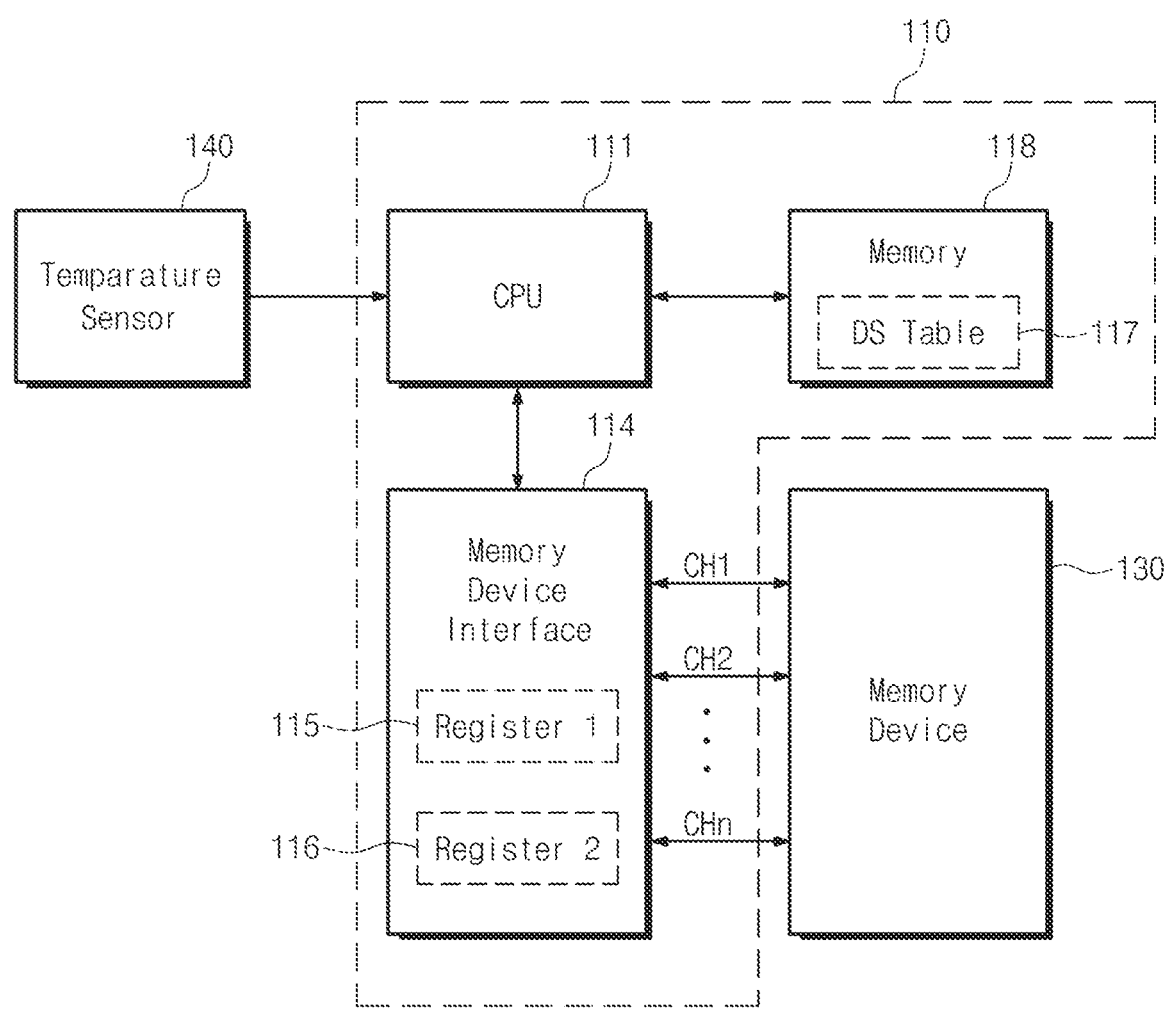
FIG. 14 illustrates an embodiment of an SSD controller according to the present general inventive concept.

FIG. 14 illustrates an embodiment of an SSD controller 110, temperature sensor 140, and memory devices 130 similar to those of FIGS. 2 and 3. As illustrated in FIG. 14, the SSD controller 110 may include memory 118 that includes the drive strength table 117. According to one embodiment, the CPU 111 may receive the temperature data from the temperature sensor 140 and the memory device number data from the memory device interface 114, may access the drive strength table 117, and may output a drive strength value from the drive strength table 117 to one of the registers 115 and 116. In such a case, the registers 115 and 116 may correspond to different channels or different drive strength values.

According to another embodiment of the present general inventive concept, the CPU 111 may access a first portion of the drive strength table 117 to adjust the contents of one register 114 to correspond to a number of memory devices 130 and another portion of the drive strength table 117 to adjust the contents of the other register 116 to correspond to the detected temperature. Then, the value of both registers may determine an output drive signal.

The memory devices and/or SSD controllers according to the embodiments may be mounted in various forms of packages. For example, the memory devices and/or SSD controllers may be mounted in packages such as Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

According to the above embodiments, data storage devices controlling signal strength of a memory channel according to changes of the operating environment can be provided. Therefore, a data storage device can be implemented to have low-power and high-reliability.

The above-disclosed subject matter is to be considered illustrative and not restrictive, and the appended claims are intended to cover all such modifications, enhancements, and other embodiments, which fall within the scope of the general inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A data storage device comprising:
   a plurality of memory devices; and
   a memory controller to exchange data with the plurality of memory devices via a plurality of channels, respectively, the memory controller to determine a current temperature thereof and a number of the plurality of memory devices connected to a respective channel, and to adjust a drive strength of the plurality of channels based on at least one of a number of the plurality of memory devices and the current temperature,
   wherein, based on at least one of the number of the plurality of memory devices and the current temperature, the memory controller performs at least one of a partial band activation mode to activate a portion of the plurality of channels according to the number of the plurality of memory devices or the current temperature, a partial interleaving mode to adjust the number of the memory devices interleaving-accessed in the activated channels, and a channel skew mode to allow different data transfer timings between the activated channels.

2. The data storage device of claim 1, wherein the memory controller adjusts the drive strength according to the number of the memory devices connected to the plurality of channels, respectively.

3. The data storage device of claim 2, wherein the memory controller increases the drive strength of the plurality of memory channels as the number of the memory devices respectively connected to the plurality of channels increases.

4. The data storage device of claim 1, wherein the memory controller drives the plurality of memory channels at stronger signal strength when the current temperature is higher.

5. The data storage device of claim 1, wherein the plurality of channels comprise a plurality of memory slots, and the plurality of memory devices comprise memory modules to be connected to the plurality of channels.

6. The data storage device of claim 1, wherein the memory controller comprises a drive strength table to provide the drive strength corresponding to the number of the plurality of memory devices and the current temperature.

7. The data storage device of claim 1, wherein the memory controller comprises a drive strength register to adjust the drive strength of the plurality of channels, respectively.

8. The data storage device of claim 1, wherein the memory controller further comprises a temperature sensor to provide information on the current temperature of the data storage device to the data storage device.

9. A method of setting memory channels of a data storage device, the method comprising:
   detecting a number of memory devices connected to the memory channels, respectively;
   detecting a temperature of the data storage device; and
   setting an output driver to drive the memory channels at a drive strength corresponding to at least one of the detected number of memory devices and the detected temperature,
   wherein, based on at least one of the number of the plurality of memory devices and the current temperature, the memory controller performs at least one of a partial band activation mode to activate a portion of the plurality of channels according to the number of the plurality of memory devices or the current temperature, a partial interleaving mode to adjust the number of the memory devices interleaving-accessed in the activated channels, and a channel skew mode to allow different data transfer timings between the activated channels.

10. A memory module, comprising:
    a plurality of memory devices to store data;
    a controller to transmit data to and from the plurality of memory devices via a plurality of channels; and
    a temperature sensor to determine a current temperature of the controller,
    wherein the controller detects a number of memory devices connected to each channel and adjusts a drive signal to drive the plurality of memory devices according to at least one of the detected number of memory devices and the current temperature, and
    wherein, based on at least one of the number of the plurality of memory devices and the current temperature, the memory controller performs at least one of a partial band activation mode to activate a portion of the plurality of channels according to the number of the plurality of memory devices or the current temperature, a partial interleaving mode to adjust the number of the memory devices interleaving-accessed in the activated channels, and a channel skew mode to allow different data transfer timings between the activated channels.

11. The memory module according to claim 10, wherein the controller detects a total number of memory devices corresponding to all the channels and adjusts the drive signals to each channel according to the detected total number of memory devices.

12. The memory module according to claim 10, wherein the controller adjusts the drive signal to each separate channel according to the detected number of memory devices of each separate channel.

13. The memory module according to claim 10, further comprising:
    a buffer memory connected to the controller to temporarily store data to transmit to or from the plurality of memory devices.

14. The memory module according to claim 10, further comprising:
    a temperature sensor to detect a temperature of at least a portion of the memory module,
    wherein the controller adjusts the drive signal to drive the plurality of memory devices according to the detected number of memory devices and the detected temperature.

15. The memory module according to claim 14, wherein the temperature sensor detects a temperature of the controller.

16. The memory module according to claim 14, wherein the controller comprises:
    a memory device interface to transmit data to the plurality of memory devices via the plurality of channels;
    a host interface to transmit data to and from a host device external to the memory module; and
    a central processing unit (CPU) to control operation of the memory device interface and the host interface.

17. The memory module according to claim 16, wherein the memory device interface includes at least one register, and the controller adjusts the contents of the at least one register to adjust the drive signal to the plurality of memory devices.

18. The memory module according to claim 17, wherein the at least one register includes at least a first register and a second register, and
    the controller adjusts the contents of the first register according to the detected number of memory devices, and the controller adjusts the contents of the second register according to the detected temperature.

19. The memory module according to claim 17, wherein the at least one register includes a plurality of registers to correspond to the plurality of channels, and the controller adjusts the contents of each respective register to adjust the drive signal to each respective channel.

* * * * *